United States Patent
Fallesen

(10) Patent No.: US 7,634,096 B2
(45) Date of Patent: Dec. 15, 2009

(54) AMPLIFIER CIRCUIT FOR CAPACITIVE TRANSDUCERS

(75) Inventor: Carsten Fallesen, Nyborg (DK)

(73) Assignee: Epcos AG, Munich (DE)

( * ) Notice: Subject to any disclaimer, the term of this patent is extended or adjusted under 35 U.S.C. 154(b) by 1047 days.

(21) Appl. No.: 11/032,806

(22) Filed: Jan. 11, 2005

(65) Prior Publication Data
US 2005/0151589 A1 Jul. 14, 2005

Related U.S. Application Data

(60) Provisional application No. 60/535,879, filed on Jan. 12, 2004.

(51) Int. Cl.
*H04R 3/00* (2006.01)

(52) U.S. Cl. .................. 381/113; 381/120; 381/174; 330/259; 330/290

(58) Field of Classification Search .......... 381/111, 381/113, 120, 95, 174; 330/250, 259, 270, 330/290
See application file for complete search history.

(56) References Cited

U.S. PATENT DOCUMENTS

| | | | | |
|---|---|---|---|---|
| 4,063,050 A | | 12/1977 | Carlson et al. .............. 179/111 |
| 4,894,862 A | * | 1/1990 | Defretin et al. ......... 379/390.01 |
| 5,097,224 A | * | 3/1992 | Madaffari et al. ............ 330/277 |
| 5,132,634 A | * | 7/1992 | Suarez ........................ 330/129 |
| 5,861,779 A | | 1/1999 | Loeppert et al. |
| 6,160,450 A | * | 12/2000 | Eschauzier et al. .......... 330/253 |
| 6,275,109 B1 | * | 8/2001 | Tang ........................... 330/261 |
| 6,353,344 B1 | | 3/2002 | Lafort ......................... 327/108 |
| 6,366,678 B1 | * | 4/2002 | Madaffari et al. ........... 381/324 |
| 2002/0125949 A1 | * | 9/2002 | Stenberg ..................... 330/250 |
| 2003/0199130 A1 | | 10/2003 | Lafort ......................... 438/199 |

FOREIGN PATENT DOCUMENTS
EP 1 355 417 10/2003

OTHER PUBLICATIONS

"A Low-Power Low-Noise CMOS Amplifier for Neural Recording Applications," IEEE Journal of Solid-State Circuits, vol. 38, No. 6, pp. 958-965 (Jun. 2003).
European Search Report for European Application No. EP 05 07 5002, dated Apr. 12, 2005 (3 pages).
"A Mosfet Amplifier Autotracking Biasing Circuit" 8182 Motorola Technical Developments 12 Apr. 1991, Schaumburg, Illinois, US (1 page).
"A High-Speed Depletion-Mode DMOS FET For Small-Signal Applications" 2420 Elektor Electronics 14 Sep. 1988, No. 159, London, Gr. Britain (3 pages).

\* cited by examiner

*Primary Examiner*—Vivian Chin
*Assistant Examiner*—Jason R Kurr
(74) *Attorney, Agent, or Firm*—Nixon Peabody LLP

(57) ABSTRACT

An amplifier circuit for capacitive transducers, such as miniature electret or condenser microphones, wherein the amplifier circuit comprises bias control means adapted to improve settling of the amplifier circuit. Another aspect of the invention relates to a miniature condenser microphone and a monolithic integrated circuit comprising an amplifier circuit according to the present invention. The present invention provides amplifier circuits of improved performance by resolving traditionally conflicting requirements of maintaining a large input resistance of the amplifier circuit to optimize its noise performance and provide fast settling of the amplifier circuit.

20 Claims, 1 Drawing Sheet

AMPLIFIER CIRCUIT FOR CAPACITIVE TRANSDUCERS

CROSS-REFERENCE To RELATED APPLICATION

This application claims priority to U.S. Provisional Application Ser. No. 60/535,879, filed Jan. 12, 2004.

FIELD OF THE INVENTION

The present invention relates to amplifier circuits for capacitive transducers and miniature condenser microphones comprising such amplifier circuits, wherein the amplifier circuit comprises bias control means adapted to reduce settling time of a combined amplifier and capacitive transducer assembly.

Amplifier circuits in accordance with the present invention are particularly well-suited for amplifying audio signals generated by miniature condenser microphones used in compact portable communication equipment such as mobile terminals and hearing prostheses.

BACKGROUND OF THE INVENTION

Prior art amplifier circuits for capacitive transducers suffer from an unfortunate and inconvenient trade-off between low noise and fast settling time, i.e., the period of time the amplifier circuit requires for reaching its predetermined or steady-state small signal gain within 1 dB error margin after power supply voltage has been applied to the amplifier circuit.

One reason for this not entirely satisfactory situation is that opposing requirements between these performance measures exist.

At one hand, a very large input impedance of the amplifier circuit is necessary and highly desirable to optimise noise performance of the amplifier circuit.

The very large input impedance also prevents the amplifier circuit represents a significant load to the capacitive transducer which would lower output signal voltage of the capacitive transducer. On the other hand, a large settling time of the combined transducer and amplifier system is created by the combination of the very large input impedance of the amplifier circuit and the inherent capacitance of the capacitive transducer.

The large settling time is caused by a time constant of the combined capacitive transducer and amplifier that may reach a value of 10-30 seconds, or even minutes, if the input impedance of the amplifier circuit is sufficiently large to provide optimal noise performance with today's miniature capacitive transducers.

At power-on, where supply voltage is abruptly applied to the combined transducer and amplifier assembly, the amplifier circuit may be momentarily over-loaded and subsequently left in a non-operational state for unacceptable time periods during settling of the amplifier circuit until DC operating points of the amplifier circuit have been recovered. This power-on related problem is additionally reinforced by an associated lack of ability to withstand high-level acoustical signals such as low-frequency transients generated by door slams or mechanical shocks, etc. These types of high-level transients are regularly encountered during normal operation of an amplifier circuit inside a capacitive transducer and may drive instantaneous operating points of the amplifier circuit far away from their respective predetermined DC operating points, e.g. close to a supply rail. Under such adverse circumstances, a miniature microphone utilising the combined transducer and amplifier circuit may be rendered partly or completely non-operational during an extended time period.

To achieve optimal noise performance of today's miniature electret microphones, a resistive part of the input impedance of the amplifier circuit should preferably larger than 100 GΩ, or even more preferably larger than 300 GΩ. Since an input of the amplifier circuit must be operatively connected to the capacitive transducer, which may exhibit a source capacitance as small as 0.5 pF to 2.0 pF, a resistance within the above-mentioned range of magnitude is highly desirable. Furthermore, continuing reductions in outer dimensions of capacitive transducers, such as the advent of MEMS-based capacitive transducers, call for improved amplifier circuits with larger input resistance and/or better noise performance than prior art amplifier circuits to avoid comprising the performance of these small capacitive transducer element.

In prior art preamplifier designs for use with capacitive transducers, the settling time has conventionally been controlled or set by determining a minimum acceptable input resistance for a selected target noise level. U.S. Pat. No. 5,097,224 discloses a preamplifier with an input terminal set to an appropriate DC operating point, or bias point, by a non-linear device formed by a pair of cross-coupled diodes connected to a tapping point of a resistive voltage divider coupled between a supply and ground rail. The cross-coupled diode pair exhibit very high resistance due to their exponential V-I characteristic when the absolute voltage across the cross-coupled is near zero, i.e. limited to a few times kT/q (~25 mV at room temperature). U.S. Pat. No. 5,861,779 discloses a microphone preamplifier which comprises an alternative biasing scheme wherein bipolar or MOS transistors are coupled between an internal node of the preamplifier and an input terminal of the preamplifier to create a non-linear device for biasing the input of the preamplifier.

Finally, the paper "A Low-Power Low-Noise CMOS Amplifier for Neural Recording Applications" IEEE Journal of Solid State-Circuits Vol. 38, No 6 discloses a biosignal amplifier that comprises a pair of diode-coupled MOS transistors coupled between an input node and an output node of the preamplifier to create a non-linear device for biasing the input node of the preamplifier.

These prior art preamplifier bias schemes suffer from long settling times because none of the disclosed bias arrangements provides sufficient control of impedances of the utilized non-linear devices during preamplifier settling. Furthermore, these prior art preamplifier bias schemes utilize bias control means that are integral to the respective preamplifiers and lack an external reference circuit that can provide a stable reference measure for the bias control means in situations where the preamplifier has been overloaded and left in a non-operational state. This prior art bond between the bias control means and preamplifier DC bias voltages restricts the ability to independently optimize parameters of the bias control means for improved settling performance of the preamplifier circuits.

SUMMARY OF THE INVENTION

According to a first aspect of the invention an amplifier circuit for a capacitive transducer is provided wherein the amplifier circuit comprises a preamplifier adapted to receive a transducer signal through a preamplifier input and provide an amplified transducer signal at a preamplifier output. A non-linear device comprises a first terminal operatively coupled to the input of the preamplifier and a second terminal operatively coupled to a bias control means. A reference setting means is adapted to provide a predetermined reference measure associated with a DC bias setting of the preamplifier and the bias control means is responsive to a difference between the predetermined reference measure and the DC bias setting of the preamplifier to set a DC operating point of the preamplifier input.

The predetermined reference measure may advantageously be set to a value which corresponds to, or is proportional to, a desired DC bias voltage or DC bias current of a circuit node of the preamplifier. The desired DC bias voltage or DC bias current may be a DC bias voltage of an output terminal or input terminal of the preamplifier or a bias current of an internal amplification stage of the preamplifier. The amplifier circuit is preferably designed so that the predetermined reference measure tracks the relevant DC bias setting of the preamplifier across semiconductor process variations and/or temperature variations. This could for example be achieved by arranging the reference setting means and bias circuitry adapted to determine the DC bias setting of the preamplifier in close proximity on a common integrated circuit substrate. The reference setting means may advantageously be embodied as a circuit portion which is physically and electrically separate from the preamplifier. A distinct advantage of a separate reference setting means is its ability to maintain a stable predetermined reference measure under conditions where the correct DC bias setting of the preamplifier has been lost, for example, due to a large transient signal overloading the preamplifier. The bias control means may rely on such a stable predetermined reference measure to rapidly force or steer the DC operating point of the preamplifier input back to its correct or nominal value.

The bias control means may be responsive to voltage difference or current difference depending on the nature of the predetermined reference measure and the DC bias setting of the preamplifier. In case the predetermined reference measure comprises a DC reference voltage, the DC reference voltage may advantageously be derived from bandgap voltage reference based, e.g., on substrate bipolar transistors or CMOS transistors operating in weak inversion. A simple form of voltage reference setting means may comprise an outlet node of a capacitive or resistive voltage divider coupled between a pair of voltage supply rails of the amplifier circuit. DC operating points at one or several internal circuit nodes of the preamplifier may be set to their respective values based on the DC reference voltage.

The bias control means preferably comprises a bias control output operatively connected, or coupled, to the second terminal of the non-linear device. The bias control means operates by setting or forcing appropriate operating points of circuit nodes of the preamplifier by supplying current through the non-linear device during settling until the preamplifier input and output terminals reach their respective nominal DC operating points. Once the amplifier circuit has reached settled operation the difference between the predetermined reference measure and the DC bias setting of the preamplifier approaches zero and the nominal AC or small signal gain of the amplifier circuit is substantially restored. The bias control means may accordingly substantially terminate its supply of current through the non-linear device, or the bias control means may retain a certain supply of DC current through a parasitic leak resistance present at the preamplifier input.

The preamplifier preferably comprises a CMOS input transistor, such as a large area PMOS transistor to provide low noise amplification/buffering in combination with a sufficiently low input capacitance to minimize any loading the capacitive transducer.

According to a preferred embodiment of the invention, the bias control means comprises a differential servo amplifier with first and second input terminals operatively connected to a predetermined reference voltage and a DC bias voltage of the preamplifier, respectively. An output the differential servo amplifier is operatively connected to the second terminal of the non-linear device. If the DC bias voltage of the preamplifier node for some reason, such as a preceding high-level transient on the input terminal of the preamplifier, differs from the correct DC bias voltage, the differential servo amplifier serves to source or sink current to/from the input terminal of the preamplifier until the DC bias voltage of the preamplifier node is set or forced to its nominal DC operating point and steady state operation of the amplifier circuit is resumed.

Once all nodes of the preamplifier have reached their respective nominal DC operating points, the bias setting current through the non-linear device approaches zero. That causes the non-linear device to return to a high-resistance state in accordance with the specific voltage-current characteristics of the type of non-linear device in question. In its high-resistance state, the resistance of the non-linear device is preferably sufficiently large to avoid compromising noise performance of a transducer coupled to the amplifier circuit. An amplifier circuit well-suited for integration into miniature electret microphones may use a non-linear device with a resistance between 50 GΩ and 300 GΩ in its high-resistance state. According to a preferred embodiment of the invention, the amplifier circuit has an input resistance larger than 100 GΩ in a settled operation in combination with a settling time of less than 2 seconds, such as less than 1 second, or less than 500 milliseconds with the input of preamplifier connected to a source capacitance of 10 pF.

Accordingly, during settling of the amplifier circuit, the bias control means allows the input terminal to rapidly approach the appropriate DC operating point by momentary steering the non-linear device into low-impedance state by supplying a bias current through the device. Once the amplifier circuit has substantially settled, the bias control means ensures the non-linear device returns to a high-resistance state that provides optimal noise performance of the combined amplifier and transducer assembly or system.

The non-linear device may comprise symmetrical or asymmetrical non-linear resistive elements. The non-linear device may comprise a single semiconductor diode or even more preferably a pair of cross-coupled semiconductor PN junction diodes—referred to as cross-coupled diodes for short in the following. This pair of cross-coupled diodes preferably comprises poly-silicon diodes as these devices are virtually isolated from the silicon substrate in CMOS integrated circuit implementations of the amplifier circuit. Alternatively, the non-linear device may comprise one or several diode-coupled transistors as additions or replacement for one or both of the semiconductor diodes.

A second aspect of the invention relates to a monolithic integrated circuit comprising an amplifier circuit according to the invention. The present amplifier circuit is well-adapted for monolithic CMOS integration so as to support provision of a very compact, reliable and inexpensive amplifier circuit which can be placed on a suitable carrier substrate. The amplifier circuit and the carrier substrate may be fully integrateable within a housing of miniature capacitive transducer.

A third aspect of the invention relates to a miniature condenser microphone which comprises a condenser or electret-based transducer element operatively coupled to an amplifier circuit according to any of the above-described embodiments of the present invention.

Yet another aspect of the invention relates to an amplifier circuit for a capacitive transducer, comprising a preamplifier adapted to receive a transducer signal through a preamplifier input terminal and to provide an amplified transducer signal on a preamplifier output terminal, and wherein an input resistance of the amplifier circuit is larger than 100 GΩ during settled operation of the amplifier circuit and the amplifier circuit has a settling time of less than 3 seconds such as less than 1 second or less than 100 milliseconds.

The above summary of the present invention is not intended to represent each embodiment, or every aspect, of the present invention. Additional features and benefits of the present invention will become apparent from the detailed description, figures, and claims set forth below.

BRIEF DESCRIPTION OF THE DRAWINGS

A preferred embodiment of the invention will be described in the following with reference to the accompanying drawing, wherein.

Figure 1:
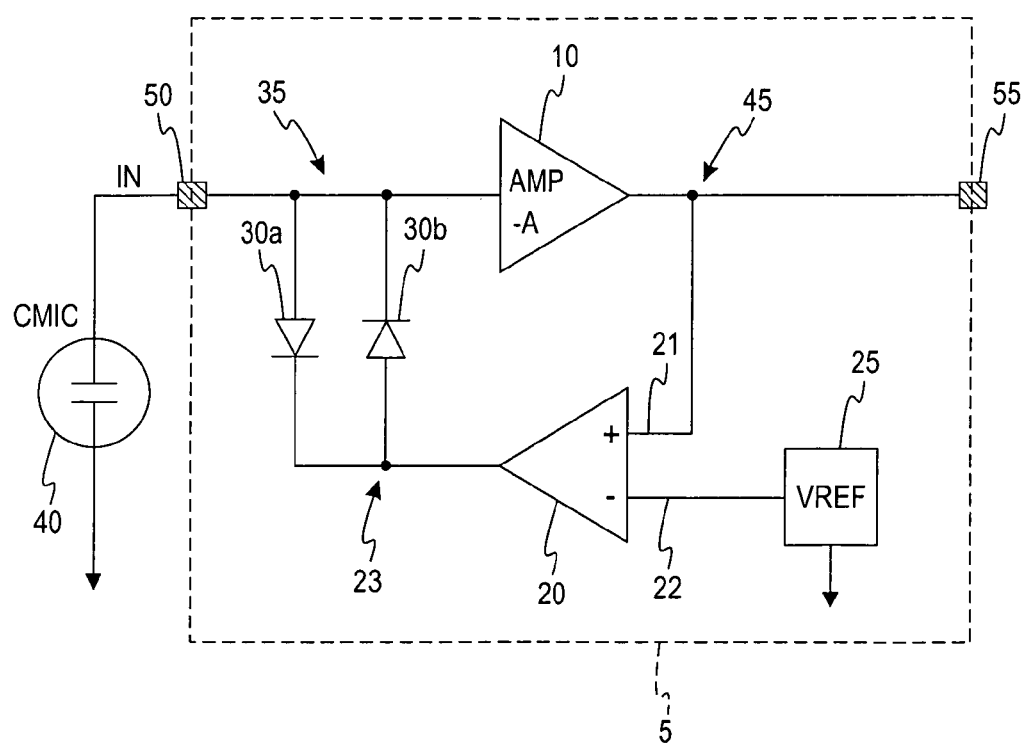
FIG. 1 is a simplified block diagram of an amplifier circuit according to the invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

FIG. 1 shows a condenser transducer element 40 of a miniature microphone coupled to an amplifier circuit integrated on a monolithic integrated die 5. According to the present embodiment of the invention, the condenser transducer element 40 comprises a MEMS-fabricated transducer of silicon base material, but the invention is equally applicable to microphones based for example on electret transducer eleelements that relies on a pre-deposited electrical charge layer of one or both transducer plates.

The amplifier circuit comprises an inverting preamplifier 10 and a differential servo amplifier 20 which has a first input connected to an output of the inverting preamplifier 45 and a second input connected to a reference voltage, VREF, generator 25. A non-linear device (30a, 30b) is coupled between an output terminal 23 of the differential servo amplifier 20 and an input node or terminal 35 of the inverting preamplifier 10. The non-linear device comprises a pair of cross-coupled semiconductor PN junction diodes, 30a and 30b. The pair of cross-coupled diodes may advantageously be implemented as a pair of poly diodes as these are virtually isolated from the silicon substrate in CMOS integrated circuit implementations. Alternatively, transistors may be applied instead of the PN junction diodes.

The electret transducer element 40 is directly coupled to an input pad 50 of the monolithic integrated circuit die 5. The input pad 50 is operatively connected to the pair of cross-coupled semiconductor PN junction diodes 30a and 30b and to the input node 35 of the inverting preamplifier 10 so as to provide an amplified and/or buffered transducer signal from the electret element 40 on output terminal or pad 55.

The amplifier circuit operates by controlling and quickly setting—without introducing steady state noise—a DC operating point of the preamplifier input 35 between the electret element 40 and the amplifier circuit, by introducing a non-linear servo loop.

This non-linear servo loop comprises the differential servo amplifier 20 with its output connected to the high impedance input 35 via the cross-coupled PN junction diodes 30a and 30b. The non-linear biasing device could comprise additional or other non-linear resistive devices exhibiting very high resistance at low current levels and lower resistance at higher current levels.

A first input node 21 of the servo amplifier 20 is connected to the output 45 of the inverting preamplifier 10 and a second input node 22 is connected to the voltage reference 25 defining a target or desired operating point at the output of the inverting preamplifier 10. In the present case where the preamplifier 10 is inverting, the first servo amplifier input should be the non-inverting input while the second input should be an inverting input. In case the preamplifier is a non-inverting design, the input terminals to the differential servo amplifier 20 should be swapped.

The operation of the amplifier circuit will be explained in the following by referring to FIG. 1. It has been assumed that the preamplifier is inverting with a numeric voltage gain of A. The voltage gain is preferably set to about 10 dB but may be as large as 60 dB depending on the particular type of capacitive transducer for which it is intended to be used. The output node 45 is always brought to virtually the same potential as VREF by operation of the servo amplifier 20. If the input 35 is rapidly brought away from its steady-state operating point, for example, by a large transient voltage applied to input 35, the output node 45 will follow nearly at the same pace and the servo amplifier 20 will try to correct for any voltage difference between preamplifier output 45 and the reference voltage, VREF, as set on the input node 22. As the cross-coupled diodes 30a and 30b are highly non-linear, the servo amplifier 20 will only need to put a moderate forward bias across one of the diodes 30a or 30b to force a significant current through to the preamplifier input node 35. In other words the preamplifier input 35 becomes rapidly charged despite the device capacitance associated with the transducer element 40 and the very high large resistance of diodes 30a or 30b during settled operation of the amplifier circuit.

Once a voltage difference between the output node 45 and VREF becomes smaller, the limited gain A of the servo amplifier 20 is unable to maintain substantial forward bias over either of the pair of cross-coupled diodes 30a and 30b. The resistance of the latter diode pair loading the input 35 will therefore dramatically increase due to the exponential V-I characteristics of each of the cross-coupled diodes 30a and 30b until the resistance reaches a level or value where the noise contribution becomes negligible. In other words, applying over-drive of the non-linear device by a servo feedback loop facilitates fast setting of DC operating points of the amplifier circuit leading to fast settling of the small signal gain.

In an embodiment of the invention, the servo amplifier 20 is a differential amplifier with a voltage gain of about 15 dB and based on a PMOS input stage. Since the tapping point (not shown) of the servo amplifier 20 is not taken directly from the output of the preamplifier 10 but from a derived, 10 dB attenuated, signal, the DC loop gain of the feedback path is also about 15 dB.

Each of the cross-coupled polysilicon diodes 30 and 30b has lateral dimensions of 0.8 μm*2.8 μm which are minimum dimensions allowed by design rules of the utilized 0.35 μm 3M CMOS process. The very small diode areas maximize diode resistance and minimize parasitic capacitive loading of the input 35 by the polysilicon diodes 30a and 30b. Furthermore, the small signal gain and frequency characteristics through the audio frequency range of a forward signal path between the preamplifier input and outputs 35 and 45, respectively, are substantially unaffected by the operation of the servo loop in settled operation of the amplifier circuit. This is possible because of the very low frequency roll-off of the servo loop as determined by a pole originating from the combination of CMIC and the large resistance of the polysilicon diodes 30 and 30b in settled operation.

Since the servo loop based on servo amplifier 20 is essentially noiseless during settled operation, another beneficial aspect of the present invention can be recognized by noting the DC bias voltage of the preamplifier output 45 is set via the servo loop and therefore any noise voltage emanating from the reference voltage generator 25 is efficiently attenuated through very effective low pass filtering in the servo loop.

Another advantageous effect provided by the present invention is that the servo loop makes the preamplifier input node 35 insensitive to parasitic leakage currents flowing into, or out from, the preamplifier input 35. The servo loop will automatically and efficiently nil leakage currents and maintain a valid operating point of the amplifier circuit even though the input resistance may be lower than the design goal under such adverse circumstances.

The present amplifier circuit has improved the traditional trade-off between low noise and fast settling time by applying a bias control means that helps settling the high impedance preamplifier input node 35 without loading the input 35 with low impedances during normal operation of the amplifier circuit.

In another embodiment of the invention the servo amplifier 20 taps the preamplifier input node 35 instead of the output node 45. This is fully acceptable as long as the servo amplifier 20 has sufficiently high input impedance to substantially avoid loading of the preamplifier input node 35. As previously mentioned, the present embodiment of the invention is well-suited for monolithic circuit integration using any select or combination of CMOS, BiCMOS, JFET integrated circuit technology.

In other embodiments of the invention, any one of the preamplifier 10, the servo amplifier 20 and/or the voltage reference generator may be supplied as separate components of the amplifier circuit and mounted on a carrier substrate that provides interconnections required to form the amplifier circuit. Likewise, a suitable voltage pump may be included to generate a suitable condenser DC bias voltage, such as a condenser bias voltage between 4 and 20 Volts, for biasing the condenser plates of the MEMS transducer element 40.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. An amplifier circuit for a capacitive transducer, comprising:
    a preamplifier adapted to receive a transducer signal through a preamplifier input and provide an amplified transducer signal at a preamplifier output;
    a non-linear device including a pair of cross-coupled semiconductor devices, wherein a first terminal of one of the semiconductor devices is operatively coupled to the input of the preamplifier and a second terminal of the semiconductor device is operatively coupled to a bias control means, wherein each of the semiconductor devices is selected from the group consisting of a semiconductor diode and a transistor; and
    reference setting means adapted to provide a predetermined reference measure associated with a DC bias setting of the preamplifier, wherein
    the bias control means is responsive to a difference between the predetermined reference measure and the DC bias setting of the preamplifier to set a DC operating point of the preamplifier input.

2. An amplifier circuit according to claim 1, wherein the reference setting means is external to the preamplifier.

3. An amplifier circuit according to claim 1, wherein the predetermined reference measure comprises a predetermined reference current, the bias control means being responsive to a current difference between a DC bias current of the preamplifier and the predetermined reference current.

4. An amplifier circuit according to claim 2, wherein the predetermined reference measure comprises a predetermined reference voltage, the bias control means being responsive to a DC voltage difference between a DC bias voltage of the preamplifier and the predetermined reference voltage.

5. An amplifier circuit according to claim 1, wherein the bias control means comprises a differential servo amplifier having a first input operatively coupled to the reference setting means and a second input operatively coupled to the preamplifier output.

6. An amplifier circuit according to claim 5, wherein a DC loop gain around the differential servo amplifier and the preamplifier is between 10 and 60 dB.

7. An amplifier circuit according to claim 4, wherein the predetermined reference voltage is associated with a DC bias voltage of the preamplifier output or input.

8. An amplifier circuit according to claim 1, wherein the cross-coupled semiconductor devices are of opposite polarity.

9. An amplifier circuit according to claim 1, wherein each of the semiconductor devices is selected from the group consisting of a semiconductor diode, a MOS transistor, and a bipolar transistor.

10. An amplifier circuit according to claim 1, wherein an input resistance of the amplifier circuit is larger than 100 GΩ in settled operation and a settling time of the amplifier circuit is less than 3 seconds.

11. A monolithic integrated circuit comprising an amplifier circuit according to claim 1.

12. A miniature condenser microphone assembly comprising a housing having a sound aperture, and an amplifier circuit according to claim 1 disposed within the housing and operatively coupled to a capacitive transducer element.

13. An amplifier circuit according to claim 1, wherein the amplifier circuit is MEMS-fabricated.

14. An amplifier circuit according to claim 1, wherein the non-linear device is fabricated according to no greater than a 0.35 um CMOS process.

15. A monolithic integrated circuit, comprising:
    a preamplifier adapted to receive a transducer signal through a preamplifier input and provide an amplified transducer signal at a preamplifier output;
    a non-linear device including a pair of cross-coupled semiconductor devices, wherein a first terminal of one of the semiconductor devices is operatively coupled to the input of the preamplifier and a second terminal of the semiconductor device is operatively coupled to a bias control means, wherein each of the semiconductor devices is selected from the group consisting of a semiconductor diode and a transistor; and
    reference setting means adapted to provide a predetermined reference measure associated with a DC bias setting of the preamplifier, wherein
    the bias control means is responsive to a difference between the predetermined reference measure and the DC bias setting of the preamplifier to set a DC operating point of the preamplifier input.

16. The monolithic integrated circuit according to claim 15, wherein said reference setting means includes a voltage divider and is external to the preamplifier.

17. The monolithic integrated circuit according to claim 15 in combination with a hearing aid, wherein the monolithic integrated circuit is disposed within the hearing aid.

18. The monolithic integrated circuit according to claim 15, wherein the monolithic integrated circuit is MEMS-fabricated.

19. The monolithic integrated circuit according to claim 15, wherein the non-linear device is fabricated according to no greater than a 0.35 um CMOS process.

20. The monolithic integrated circuit according to claim 15, wherein the monolithic integrated circuit is fabricated according to a process technology selected from the group consisting of CMOS, BiCMOS, JFET, and any combination thereof.

* * * * *

UNITED STATES PATENT AND TRADEMARK OFFICE
CERTIFICATE OF CORRECTION

PATENT NO.        : 7,634,096 B2                                     Page 1 of 1
APPLICATION NO. : 11/032806
DATED             : December 15, 2009
INVENTOR(S)       : Carsten Fallesen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1346 days.

Signed and Sealed this

Ninth Day of November, 2010

David J. Kappos
*Director of the United States Patent and Trademark Office*